United States Patent
Cascio et al.

(10) Patent No.: US 11,601,121 B2
(45) Date of Patent: Mar. 7, 2023

(54) BOOTSTRAPPED SWITCH CIRCUIT, A TRACK-AND-HOLD CIRCUIT, AN ANALOG-TO-DIGITAL CONVERTER, A METHOD FOR OPERATING A TRACK-AND-HOLD CIRCUIT, A BASE STATION AND A MOBILE DEVICE

(71) Applicant: Intel Corporation, Santa Clara, CA (US)

(72) Inventors: Giacomo Cascio, Villach (AT); Martin Clara, Santa Clara, CA (US); Christian Lindholm, Villach (AT)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 16/912,800

(22) Filed: Jun. 26, 2020

(65) Prior Publication Data
US 2021/0409015 A1    Dec. 30, 2021

(51) Int. Cl.
| | |
|---|---|
| H03K 17/041 | (2006.01) |
| G11C 27/02 | (2006.01) |
| H03F 3/45 | (2006.01) |
| H03M 1/12 | (2006.01) |
| H04B 1/40 | (2015.01) |

(52) U.S. Cl.
CPC ....... *H03K 17/04106* (2013.01); *G11C 27/02* (2013.01); *H03F 3/45179* (2013.01); *H03M 1/1245* (2013.01); *H04B 1/40* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 8,183,890 | B1* | 5/2012 | Oo | G11C 27/024 |
| | | | | 327/427 |
| 2004/0257150 | A1* | 12/2004 | Farooqui | G05F 3/30 |
| | | | | 327/539 |
| 2012/0044004 | A1* | 2/2012 | Payne | H03M 1/08 |
| | | | | 327/161 |

(Continued)

FOREIGN PATENT DOCUMENTS

JP    2018029961 A    3/2018

OTHER PUBLICATIONS

Anonymous: "Common Collector—Wikipedia, The Free Encyclopedia" (Jan. 12, 2016), XP055240687, Retrieved from the Internet: URL:https://en.wikipedia.org/wiki/Common_collector [retrieved on Jan. 12, 2016].

(Continued)

*Primary Examiner* — Daniel C Puentes
(74) *Attorney, Agent, or Firm* — 2SPL Patentanwälte PartG mbB; Yong Beom Hwang

(57) ABSTRACT

The present disclosure relates to a bootstrapped switch circuit, a track-and-hold circuit, an analog-to-digital converter, a method for operating a track-and-hold circuit, a base station, and a mobile station. The bootstrapped switch circuit comprises an output for an output signal, a first input, a switching element configured to couple the output with a signal from the first input, a bootstrapper capacitor configured to drive the switching element, and a second input coupled to the bootstrapper capacitor.

22 Claims, 14 Drawing Sheets

(56) References Cited

U.S. PATENT DOCUMENTS

2015/0173846 A1 6/2015 Schneider et al.
2017/0259428 A1 9/2017 Assad et al.

OTHER PUBLICATIONS

Nordholt E.H.: "Design of High-Performance Negative Feedback Amplifiers—Chapter 1" (Jun. 18, 1980), XP055808646, Retrieved from the Internet: URL:https://repository.tudelft.nl/islandora/object/uuid:54fb267c-7101-4cb7-a4d9-a9ad2da14650/datastream/OBJ/download [retrieved on May 28, 2021].
Andrew M. Abo et al., A 1.5-V, 10-bit, 14.3-MS/s CMOS Pipeline Analog-to-Digital Converter, IEEE J. Solid-State Circuits, vol. 34, pp. 599-606, May 1999.
Behzad Razavi, "The Bootstrapped Switch", IEEE Solid-State Circuits Magazine, pp. 12-15, 2015.
A. M. Abo and P. R. Gray, "A 1.5-V 10-bit, 14.3 MS/s CMOS pipeline analog-to-digital converter" IEEE J. Solid-State Circuits, vol. 34, pp. 599-606, May 1999.
B. Razavi, "The Bootstrapped Switch", ISSC Magazine, 2015.
https://web.archive.org/web/20200229005721/https://en.wikipedia.org/wiki/Bootstrapping_(electronics).

* cited by examiner

BOOTSTRAPPED SWITCH CIRCUIT, A TRACK-AND-HOLD CIRCUIT, AN ANALOG-TO-DIGITAL CONVERTER, A METHOD FOR OPERATING A TRACK-AND-HOLD CIRCUIT, A BASE STATION AND A MOBILE DEVICE

FIELD

The present disclosure generally relates to a bootstrapped switch circuit, a track-and-hold circuit, an analog-to-digital converter, and a method for operating a track-and-hold circuit, a base station, and a mobile station, more particularly, but not exclusively, to a concept for a dual input bootstrapped switch circuit.

BACKGROUND

In analog-to-digital conversion (ADC) circuits an analog input signal travels across packages, interconnections, blocks, transmission lines from a transmitter to a receiver and a high level of signal integrity should be guaranteed, if correct data should be captured. Every conductor has a frequency-dependent resistance (R)/conductance (G), capacitance (C), and/or inductance (L). Thus, at a high-enough frequency, a wire is no longer a wire but a distributed, frequency-dependent parasitic element with an impedance profile that can cause distortion when connected to a dynamic circuit, e.g. a front-end track-and-hold (T/H) circuit at the input of an ADC.

A multi-GHz input signal is not contained in the conductor itself but is, instead, carried in the local electric and magnetic fields around the conductors. Furthermore, an input signal, which comprises useful info to be postprocessed, can be affected by other signals, therefore R-L-C components of all the conductor structures have vital roles of guaranteeing proper signal integrity along the path toward a receiver.

BRIEF DESCRIPTION OF THE FIGURES

Some examples of apparatuses and/or methods will be described in the following by way of example only, and with reference to the accompanying figures, in which

FIG. 6 shows a single-array time-interleaved ADC with bootstrapped switches with dual input;

DETAILED DESCRIPTION

Figure 1:
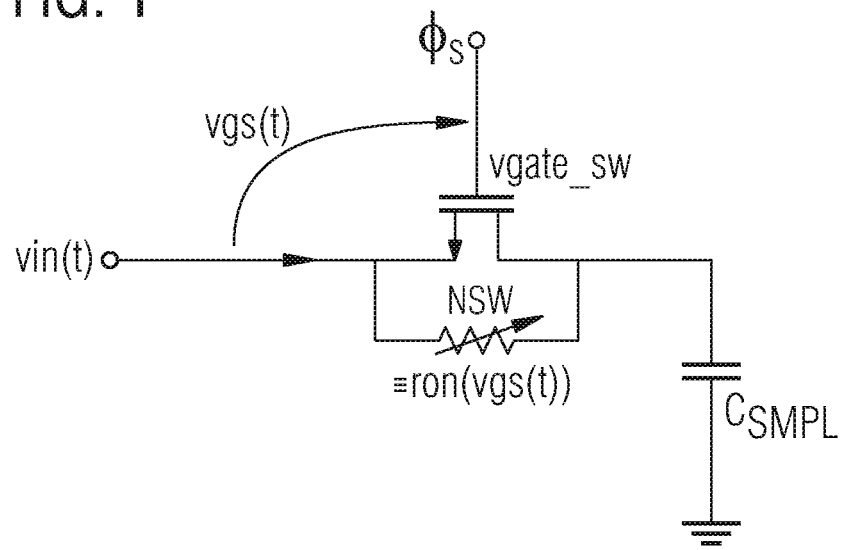
FIG. 1 shows a passive track-and-hold with an NMOS switch.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

In ADC circuits to improve or even maximize a speed of operation, the timing uncertainty and timing-varying errors may be reduced or even minimized. An important aspect is to maintain the signal integrity of a bootstrapped switch for a track-and-hold circuit used, for example, for sampling an input signal in a time-interleaved analog-to-digital converter with multiGSample/s aggregate sampling rate and multi-GHz analog radio frequency (RF)-bandwidth. In a time-interleaved ADC architecture with distributed track-and-hold (T/H) each ADC-slice front-end subsamples the input signal and requires an acquisition bandwidth commensurate with the input signal bandwidth. A general concern in sampling circuits is thermal noise, which has a variance of kT/C (k being the Boltzmann constant, T being temperature, and C being the capacity). A minimum acceptable capacitance $C_{min}$ can be derived by setting the thermal noise variance to be less than a quarter of the quantization noise variance.

This minimum sampling capacitor size (given by the specified noise performance) requires a certain size of the input switch in the T/H-circuit, in order to guarantee sufficient bandwidth and linearity of the track-and-hold, with a tradeoff between $r_{on}$ (resistance of the switch when switched "on") versus non-linear (i.e. signal dependent) charge injection. A passive track-and-hold is depicted in FIG. 1, and it uses an NMOS (n-type metal oxide semiconductor) switch (NSW, which can also be a pass-gate NMOS and PMOS in parallel) driven by a sampling signal yin (t) and coupled to a sampling capacitor $C_{SMPL}$. The signals vin(t) and φs (clock signal) determine the gate-source voltage vgs(t), which determines the gate voltage vgate_sw and triggers the switching element. FIG. 1 also indicates the on-resistance ron(vgs(t)). When switched on, the sampling capacitor $C_{SMPL}$ is (ideally) charged with vin(t).

Figure 2:
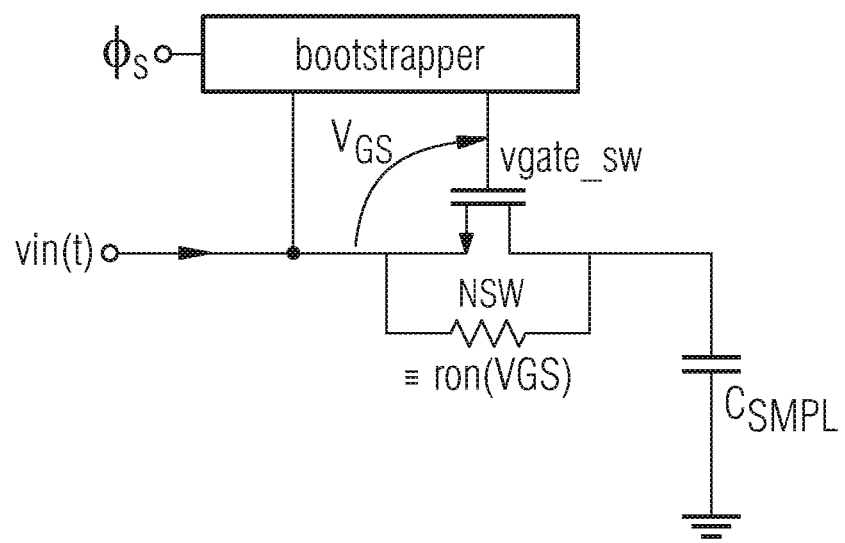
FIG. 2 shows an active track-and-hold with a bootstrapped switch.

An alternative implementation using a bootstrapped circuit is depicted in FIG. 2. FIG. 2 shows an active track-and-hold circuit with a bootstrapped switch, which results in a lower power and more reliable track-and-hold operation compared to the circuit shown in FIG. 1.

Although a single NMOS switch (NSW) followed by a sampling capacitor (FIG. 1) is an attractive candidate for a passive track-and-hold, it does not provide enough linearity at high frequencies. Furthermore, its performance is also dependent on the input common-mode and on the input signal amplitude: the gate-source voltage vgs(t) of the switch is modulated by the input signal.

To first-order, bootstrapping the switch (FIG. 2) separates the linearity performance of the track-and-hold from the input common-mode and amplitude due to the improved resistor linearity and is a more practical solution with high frequency input signals. Herein the term bootstrapping is to be understood as using components to balance a potential between two nodes in a circuit, e.g. with the purpose of increasing the linearity of the circuit, which may coincide with increasing an input impedance of the circuit. For example, MOS can be used as indicated in FIGS. 1 and 2 as switches with input-dependent on-resistance, thereby introducing distortion. The bootstrapping may reduce the switch on-resistance variation in the presence of large input and output voltage swings.

An issue of the standard bootstrapped track-and-hold solution is represented by the limited signal integrity of the sampling signal as time-interleaving factor N and sampling frequency of an ADC increase. Sampled signals in the sub-ADCs are significantly affected by transient switching noise, ringing and spikes due to parasitic R-L-C of the signal distribution and input radio frequency (RF)-Buffer. Clock-feedthrough and charge injection can be an issue as they degrade the sampled signal. Sizing up the sampling switch is an option, but this increases the resulting clock-feedthrough and also increases the power dissipation of the track-and-hold.

The limited signal integrity, especially sampling multi-GHz input signal, leads to a degradation of linearity and overall ADC performance, posing a serious barrier if data rate limits are to be pushed any further. Example implementations may overcome this stringent constraint, using bootstrapped switch architecture with better signal integrity performance and using dual inputs.

Examples use a bootstrapped switch with dual input in a circuit arrangement that effectively separates signal sampling, which is very sensitive and useful information, from the bootstrapped driving signal, which does not have to be as accurate.

Figure 3:
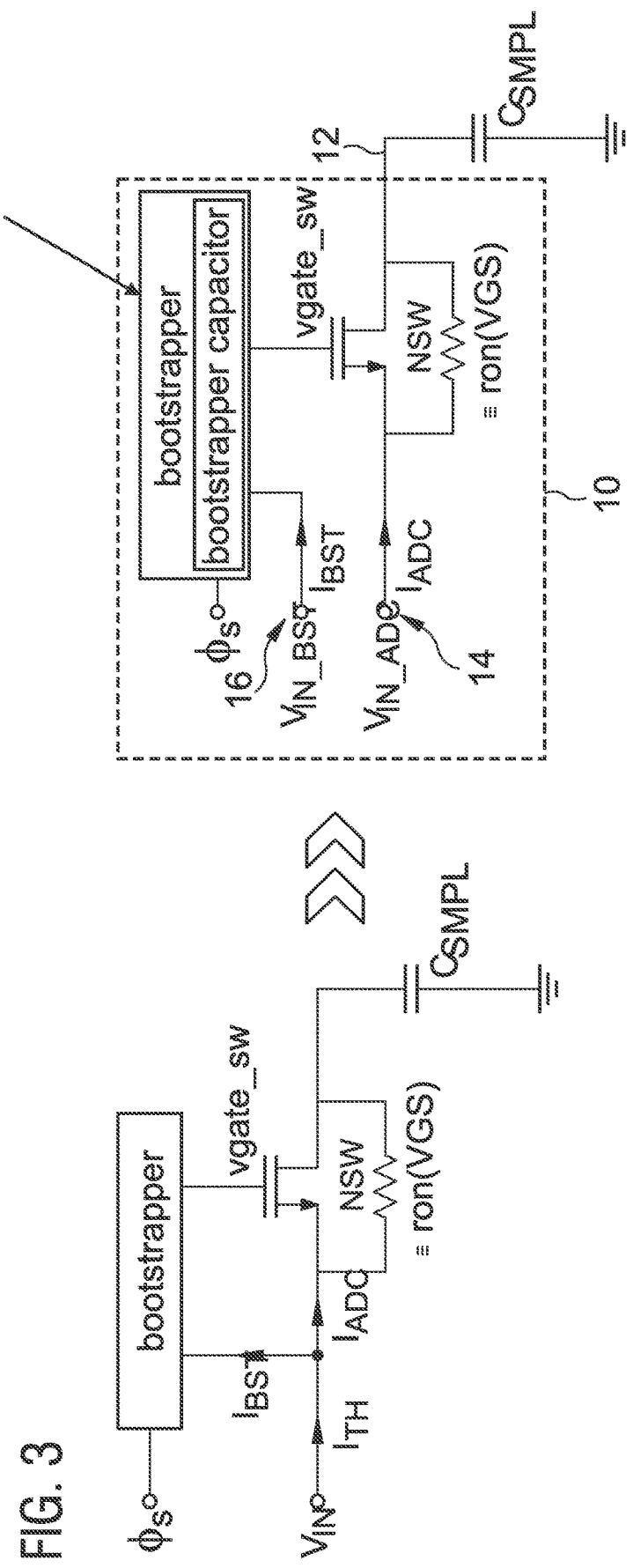
FIG. 3 shows an active track-and-hold with a bootstrapped switch on the left and an example of a bootstrapped switch with dual input for signal and bootstrap switch control on the right.

FIG. 3 shows an active track-and-hold with a bootstrapped switch on the left and an example of a bootstrapped switch 10 with dual input for signal and bootstrap switch control on the right. The structure shown on left is the one detailed above with respect to FIG. 2.

On the right, FIG. 3 shows a bootstrapped switch circuit 10. The bootstrapped switch circuit 10 comprises an output 12 for an output signal, which is coupled to the sampling capacitor $C_{SMPL}$ in the example shown in FIG. 3. The bootstrapped switch circuit 10 comprises a first input 14 ($V_{IN\_ADC}$) and a switching element (NSW) configured to couple the output 12 with a signal ($V_{IN\_ADC}$) from the first input 14. The bootstrapped switch circuit 10 further comprises a bootstrapper 25 including a bootstrapper capacitor configured to drive the switching element NSW and a second input ($V_{IN\_BST}$) coupled to the bootstrapper capacitor 25. For example, the first input 14 is configured to receive an analog voltage signal to charge the sampling capacitor $C_{SMPL}$ coupled to the output of the bootstrapped switch circuit 10. The switching element may be an n-type metal-oxide semiconductor, NMOS, a p-type metal-oxide semiconductor, PMOS, or a pass-gate NMOS with a p-type metal-oxide semiconductor, PMOS, in parallel.

The example of the bootstrapped switch circuit has two independent inputs 14, 16: $V_{IN\_ADC}$ input is the sampled ADC signal which has stringent signal integrity constraints to maintain high ADC performance, and the second one $V_{IN\_BST}$ can be more dynamically "noisy" (e.g. ringing, incomplete settling) and with relaxed signal integrity requirement—which is used to charge the bootstrapper capacitor to drive the sampling switch NSW.

The input signal to the switch is a linear analog signal driven by another circuit (e.g. a voltage buffer). Even if a front-end T/H-circuit before the buffer has already sampled the analog input, the distribution of the sampled voltage in a time-interleaved ADC may still use a voltage buffer and a distribution network. As far as the switch itself is concerned, the input signal may always be an analog signal. For example, the first input 12 is configured to receive an analog voltage signal to charge the sampling capacitor $C_{SMPL}$ coupled to the output of the bootstrapped switch in a sample-and-hold circuit. As will be outlined in further detail subsequently, the bootstrapped switch and the sampling capacitor connected to its output, plus may be one other switch at the other terminal of the sampling capacitor, together may form a sample-and-hold circuit.

Figure 4:
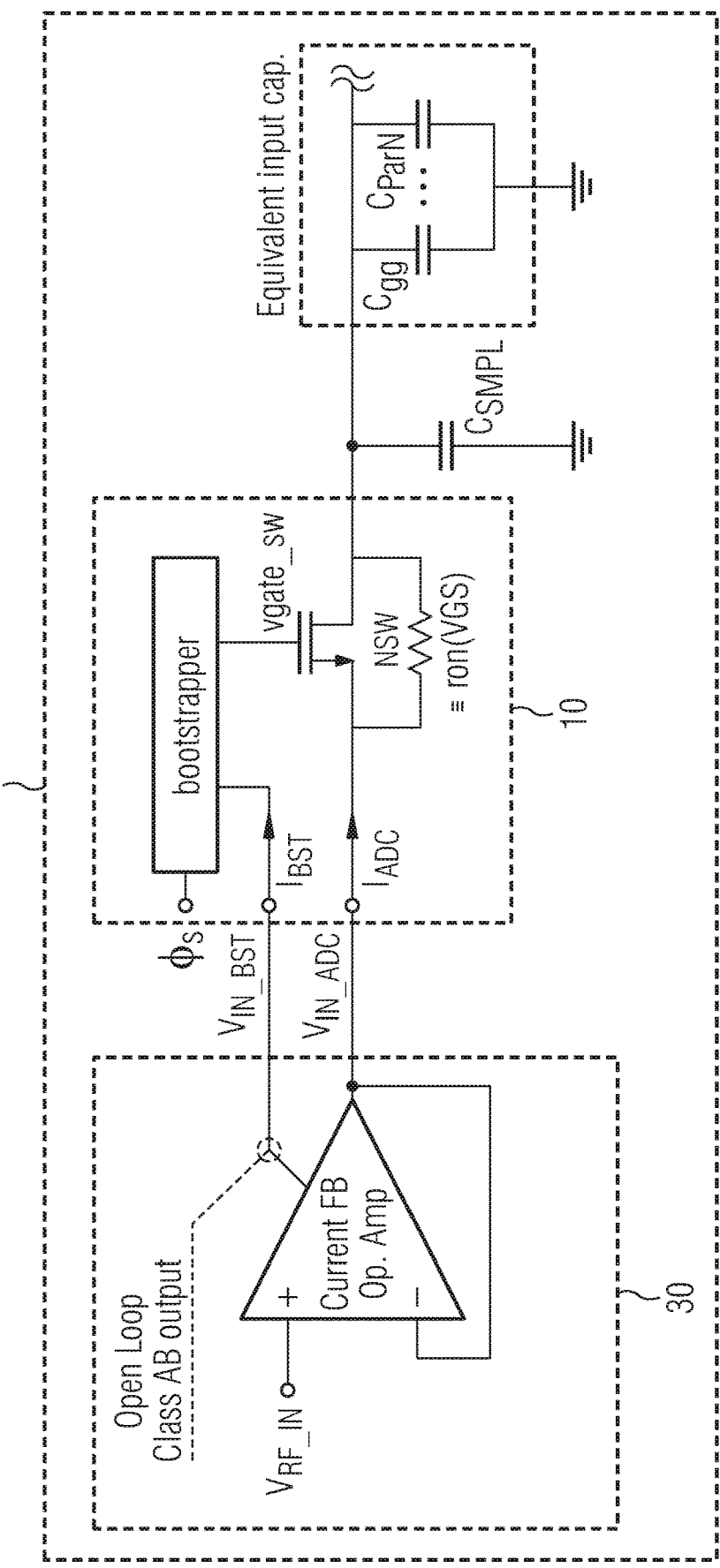
FIG. 4 shows a principle schematic of a bootstrapped switch with dual input, driven by a current-feedback operational amplifier with multiple outputs.

Another example is a track-and-hold circuit comprising a bootstrapped switch circuit 10 as described above. FIG. 4 shows a principle schematic of a bootstrapped switch circuit with dual input driven by a current-feedback operational amplifier with multiple outputs. FIG. 4 further illustrates a track-and-hold circuit 20 that comprises the bootstrapped switch circuit 10 as shown in FIG. 3 and which further comprises a sampling capacitor $C_{SMPL}$ coupled to the output. FIG. 4 further shows equivalent input capacities of the switching element NSW in parallel to the sampling capacitor $C_{SMPL}$.

The track-and-hold circuit 20 shown in FIG. 4 further comprises a driving circuit 30 configured to provide two coupled driving signals for the first and second inputs of the bootstrapped switch circuit 10. The driving circuit 30 is further configured to provide the two coupled driving signals as in-phase signals. In-phase in this context means that the signals are theoretically in phase, practically they may have a phase mismatch of less than 20%, 10%, 5%, 3%, 2%, or 1% of a sampling clock period. The sampling clock in this example generates the clock signal φs and the phase mismatch or delay may refer to the sampling clock period at the highest frequency of interest. Furthermore, the driving circuit 30 is further configured to provide the two coupled driving signals with similar amplitudes. Similar amplitudes in this context means that the signals theoretically have the same amplitude, but practically their amplitudes may differ from each other by less than 25%, 10%, 5%, 3%, 2%, or 1%. In examples, there may be an (unintentional) phase mismatch or delay and an amplitude mismatch between the two signals. In the implementation signal relations at the end of the sampling period may be most relevant (when the switch closes). For example, a source follower circuit may be used without feedback and one buffer with feedback may be used, a split buffer, respectively.

As shown in FIG. 4, the signals are coupled through the same operational amplifier circuit. In the example, the driving circuit 30 is further configured to provide the two coupled driving signals as voltage signals $V_{IN\_ADC}$ and $V_{IN\_BST}$. The driving circuit 30 comprises an operational amplifier circuit, which is configured to provide the two coupled driving signals as voltage signals $V_{IN\_ADC}$ and $V_{IN\_BST}$.

Moreover, the driving circuit 30 is further configured to provide the two coupled driving signals as a closed loop driving signal and an open loop driving signal. The operational amplifier takes an RF input signal $V_{RF\_IN}$ and generates the two coupled output signals based thereon. As can be seen in FIG. 4 the operational amplifier generates at least a closed loop output $V_{IN\_ADC}$ coupled to the first input of the bootstrapped switch circuit and an open loop output $V_{IN\_BST}$ coupled to the second input of the bootstrapped switch circuit. The open loop output comprises an open-loop voltage-follower in tracking (coupled) with the closed loop output and driven by a current-mode operational transconductance amplifier. In this example the open-loop voltage-follower is a class AB output of the operational amplifier.

A dual source follower driven by a current-mode feedback driving stage with feedback closed around ADC signal output ($V_{IN\_ADC}$) and the other ($V_{IN\_BST}$) operated in open-loop is used to drive the voltages at the separated track-and-hold inputs. In the example, the RF-Buffer as well as the signal distribution have two dedicated and distinct signal outputs driving potentially "N" track-and-hold circuits at the front-ends of the sub-ADCs, in a multi-GS/s time-interleaved A/D converter as further detailed in FIG. 6.

Another example is therefore an analog-to-digital converter comprising one or more track-and-hold circuits as described herein. For example, the analog-to-digital converter may comprise a plurality of track-and-hold circuits and it may be configured to operate in a time-interleaved manner.

Inherently and from system perspective, examples may extent to the ADC signal distribution and RF-Buffer which provide the sampling signal to the circuit arrangement. In an example, such a method may be used in a multi-array time-interleaved ADC with two ADC sub-arrays and 2 RF-buffers, each implementing the described method.

Examples may reduce or even minimize a power penalty while increasing signal integrity of multi-GHz input sampled signals with improvement of key performance figures such as ADC linearity, bandwidth, settling-time, switching noise mitigation.

The dual and independent input structure of the track-and-hold, with one dedicated input for bootstrapper block $V_{IN\_BST}$ and one for ADC sampling $V_{IN\_ADC}$, adds an important degree of freedom in the bootstrapper design (e.g. switches size, capacitor etc.) without impacting sampling performance.

Examples of the bootstrapper switch circuit can be implemented in a modular way and may be independent with respect to an ADC architecture. Examples may be particularly suitable for multi-GS/s time-interleaved ADC having high linearity constraint with multi-GHz input signal sampling.

In modern high-speed analog-to-digital converters the input signal sampling process has a crucial role. The limitations of the sampling process and the optimization of the function may define an overall system performance.

Often this function is realized as a track-and-hold (T&H) circuit that creates a stable signal for a part of the sample period of the ADC. As described above the most elementary T&H circuit consists of a switch and a capacitor, cf. FIG. 1. During the conducting phase of the switch, the signal on the capacitor follows (tracks) the input signal, while in the isolating phase (hold) the signal value remains fixed at its value at the moment of opening the switch. This moment is the theoretical sampling point in time.

The track-and-hold circuit should fulfil the requirements of linearity, maximum sampling speed and bandwidth in the analog domain as well as in the sampled data domain (e.g. settling time). In order to achieve maximum signal-to-noise-and-distortion ratio the T&H circuit has to handle the maximum input amplitude, which in most applications makes the solution in FIG. 1 unusable due to poor linearity performance. The speed and amplitude specifications make the T&H circuit as one of the most critical components in realizing an optimum conversion performance. The specification of the performance of a T&H circuit consists of the standard analog requirements: distortion, signal-to-noise ratio, signal integrity, power consumption.

To keep the on-resistance of the sampling switch independent of the input signal voltage swing, bootstrapping techniques are generally used, cf. FIG. 2. In these schemes the effective drive voltage can be increased beyond the power supply limits. This principle has been implemented in CMOS in various forms, mostly with only one or two capacitors.

The bootstrapped capacitor has typically a value ten times the gate capacitance of the switch and it is charged to the power supply during the hold phase of the T&H circuit. In the track phase, this capacitor is connected between the input voltage (VIN pin in FIG. 2) and the gate of the transistor. The input voltage (VIN pin in FIG. 2) of the T&H serves to push the capacitor top plate voltage to levels beyond the supply, maintaining a constant VGS applied to the sampling NMOS switch (Ron fixed) over the input range.

Since the bootstrapper capacitor is at least ten times the gate capacitance of the switch ($C_{BST} \approx 10 \cdot C_{g\_sw}$ and $C_{SMPL} \leq C_{g\_sw}$) the driving input current of the bootstrapper $I_{BST}$ is much higher than the current $I_{ADC}$ (the useful signal) used to charge the sampling capacitor (FIG. 3): $I_{T\&H} \approx I_{BST} + I_{ADC}$ with $I_{BST} \gg I_{ADC}$. As a consequence, the bootstrapper driving signal can significantly degrade the signal integrity of the sampled input signal, reducing T&H performance.

Examples overcome this limitation using a bootstrapped switch circuit 10 arrangement with dual input (cf. FIG. 3 on the right), to effectively separate signal sampling, which is very sensitive and useful information, from the bootstrapped driving signal, which can be less accurate.

In examples of the bootstrapped switch circuit 10 arrangement, T&H linearity performance (function of ron($V_{GS\_SW}$)) is maintained as long as the two independent inputs are in tracking and kept equipotential ($V_{IN\_ADC} = V_{IN\_BST}$) fixing $V_{GS\_SW}$ over the input range. This is accomplished, for example, by using a current-mode operational amplifier with multiple class AB driving outputs, as depicted in FIG. 4.

Operational amplifier feedback is closed at the signal sampling input ($V_{IN\_ADC}$), which is crucial for ADC performance and has stringent signal integrity constraints, while the bootstrapper driving signal ($V_{IN\_BST}$) is provided with an open-loop voltage-follower, class AB output, in tracking with the main regulated output and driven by a current-mode OTA (operational transconductance amplifier) stage.

Figure 5:
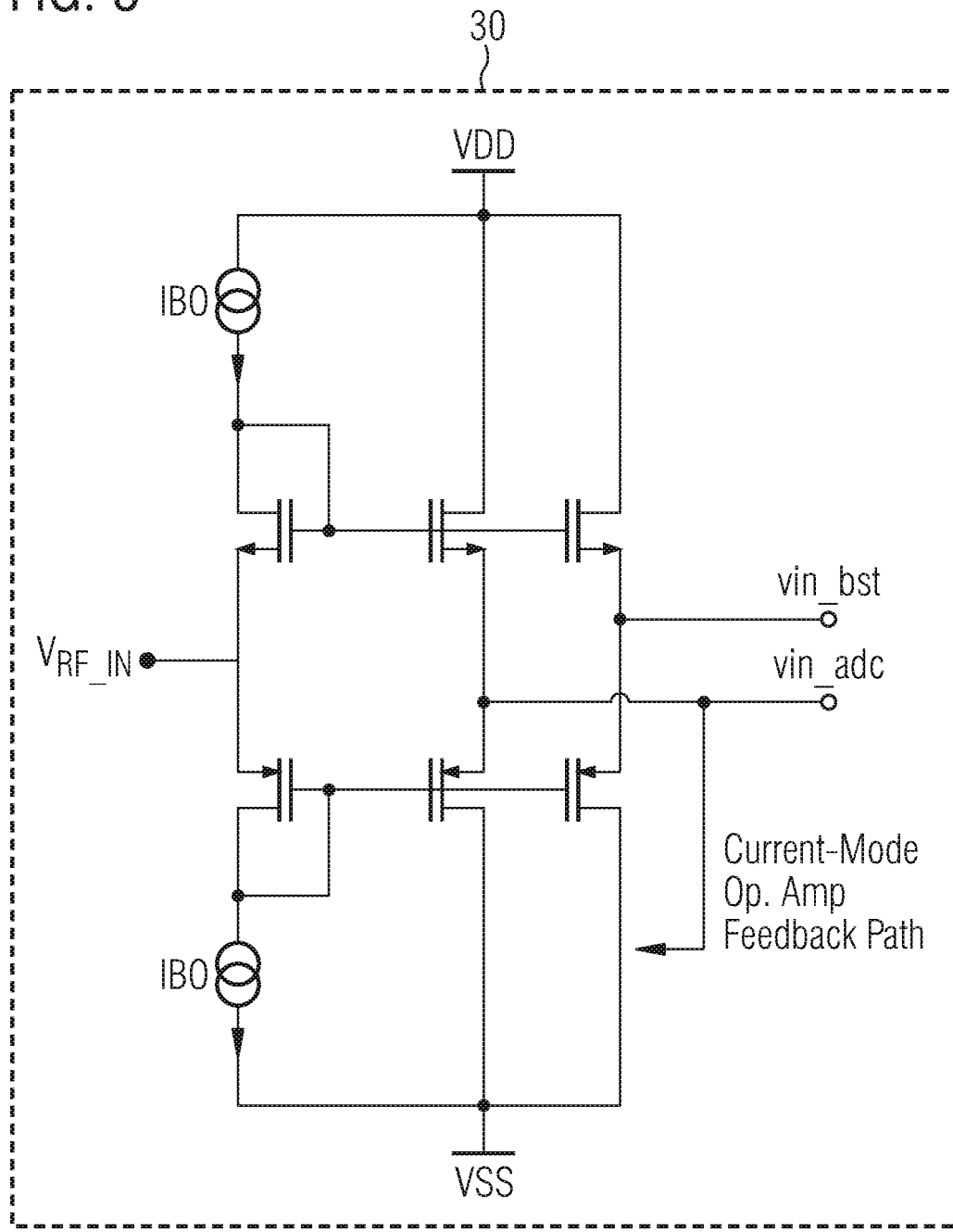
FIG. 5 shows a voltage-follower output stage with bootstrapped switch signal and ADC driving signal.

One possible circuit arrangement of the output (preferred implementation) stage is depicted in FIG. 5. FIG. 5 shows a voltage-follower output stage with bootstrapped switch signal and ADC driving signal.

Figures 1, 6:
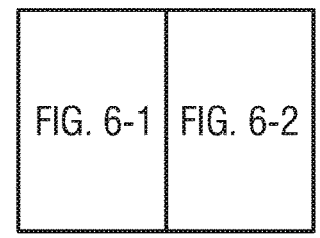
FIG. 6 is formed by the combination of FIGS. 6-1 and 6-2.
Figure 6:
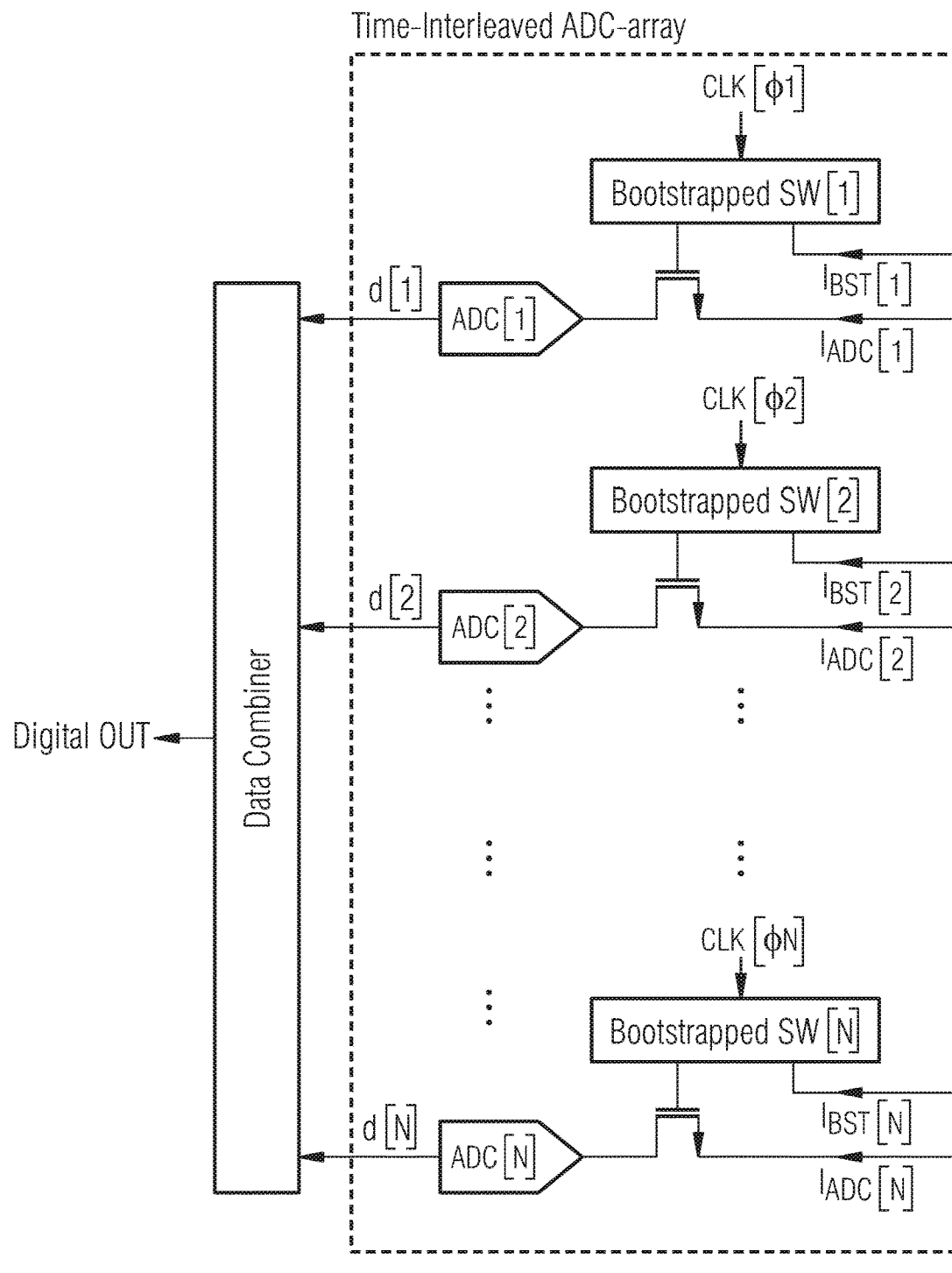
Figures 2, 6:
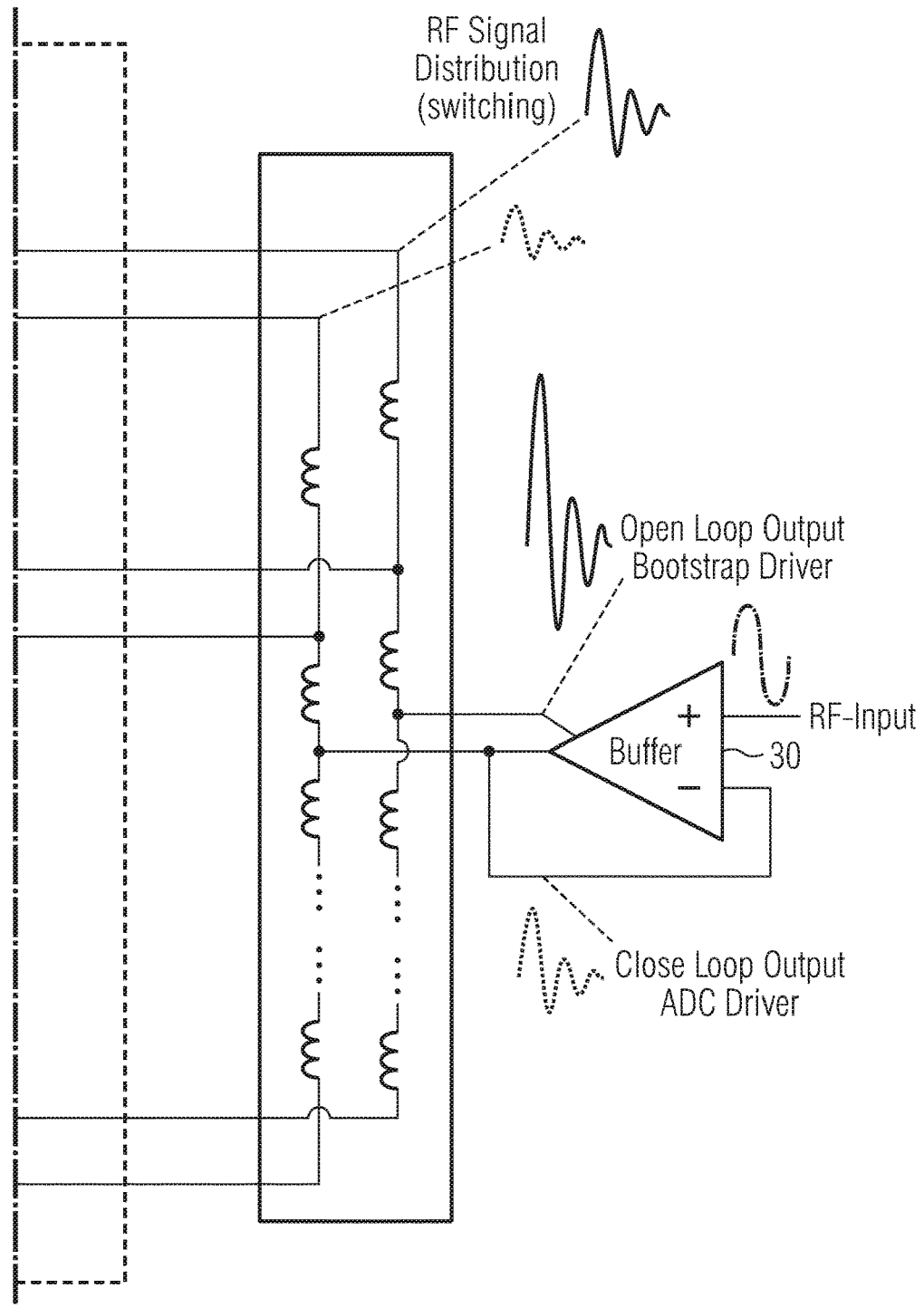

FIG. 6 is formed by the combination of FIGS. 6-1 and 6-2. FIG. 6 shows a single-array time-interleaved (TI) ADC with bootstrapped switches with dual input. FIG. 6 depicts one possible use of examples in a single-array time-interleaved ADC, particularly suitable for a multi-GSample/s converter. FIG. 6 shows an RF-Input input into a buffer 30, as detailed in the previous Figs. The buffer generates input signals $I_{BST}$ and $I_{ADC}$ for a plurality N of bootstrapped switches, which are operated in a time-interleaved manner using accordingly timed clock signals CLK[φ1], CLK[φ2], . . . , CLK[φN]. Each of the switches is coupled to an ADC stage (ADC[1], ADC[2], . . . , ADC[N]) outputting the respective digital data components, which are combined by a data combiner before the converted digital data is output.

In the example of FIG. 6, bootstrapped switches with dual input for ADC signal and bootstrap control are driven through a split RF-signal distribution for signal sampling and bootstrapped switch drive, reducing significantly switching noise on the sensitive sampling path of the sub-ADCs. The dual source follower output (in class AB), driven by current-mode feedback driving stage, has the feedback closed at sampling ADC signal path. This particular circuit arrangement may guarantee improvements of key performance figures: linearity, bandwidth, settling-time, switching noise and signal integrity.

From a system perspective, examples may extent also to RF signal distribution and RF-Buffer, making it particularly attractive for multi-GS/s TI-ADC. The method can be extended to a time-interleaved ADC consisting of multiple ADC sub-arrays (with distributed front-end T/H) with multiple dual-output RF-buffers, each driving one sub-array according to the described method. The (multiple) dual output RF-buffers can also be preceded by a single front-end T/H-circuit at the very input of the ADC.

Figure 7:
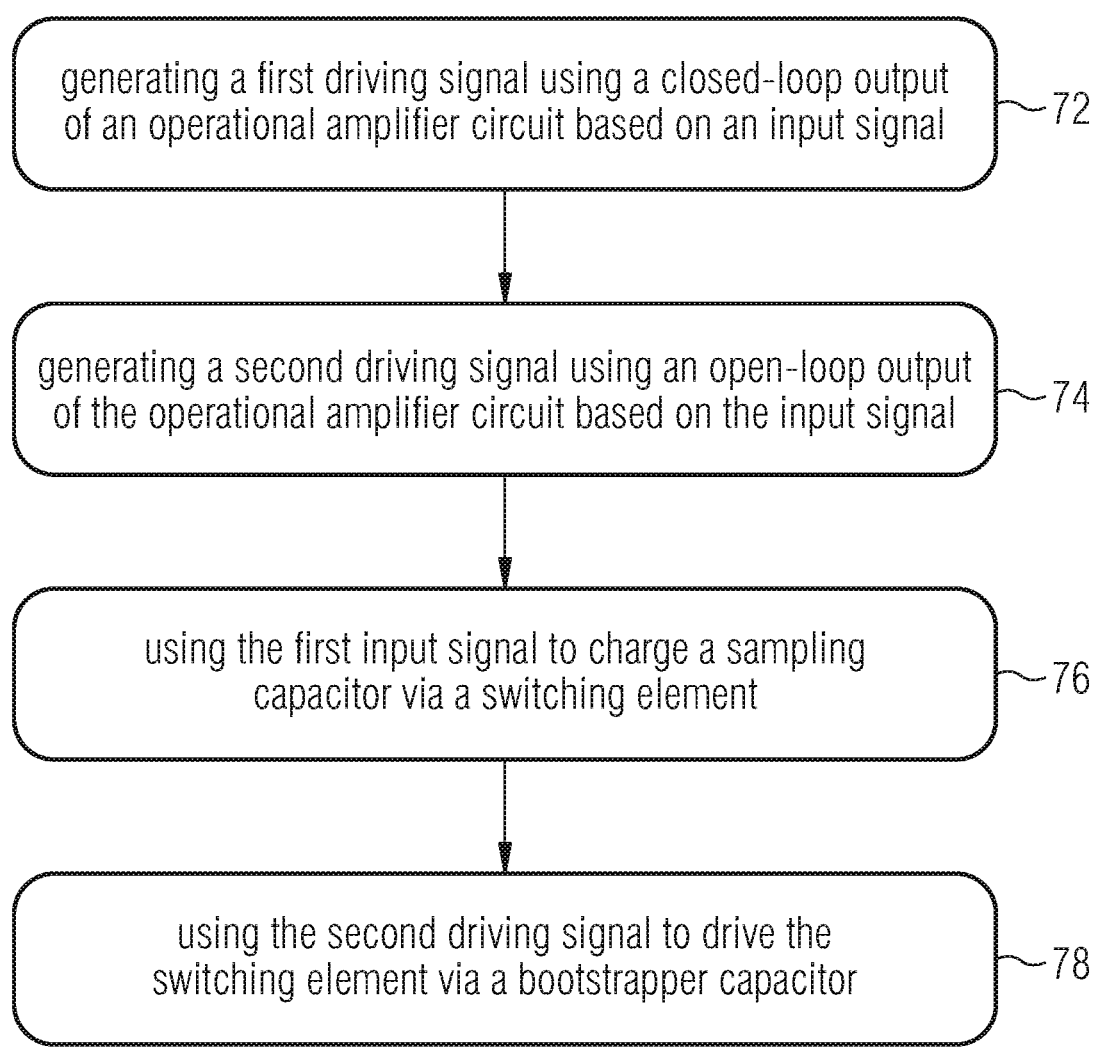
FIG. 7 shows a block diagram of an example of a method for operating a track-and-hold circuit.

FIG. 7 shows a block diagram of an example of a method for operating a track-and-hold circuit. The method 70 for operating a track-and-hold circuit comprises generating 72 a first driving signal using a closed-loop output of an operational amplifier circuit based on an input signal. The method 70 further comprises generating 74 a second driving signal using an open-loop output of the operational amplifier circuit based on the input signal and using 76 the first input signal to charge a sampling capacitor via a switching element. The method 70 further comprises using 78 the second driving signal to drive the switching element via a bootstrapper capacitor.

For example, the method 70 may further comprise operating a plurality of track-and-hold circuits in a time interleaved manner in line with the above description.

Figure 8:
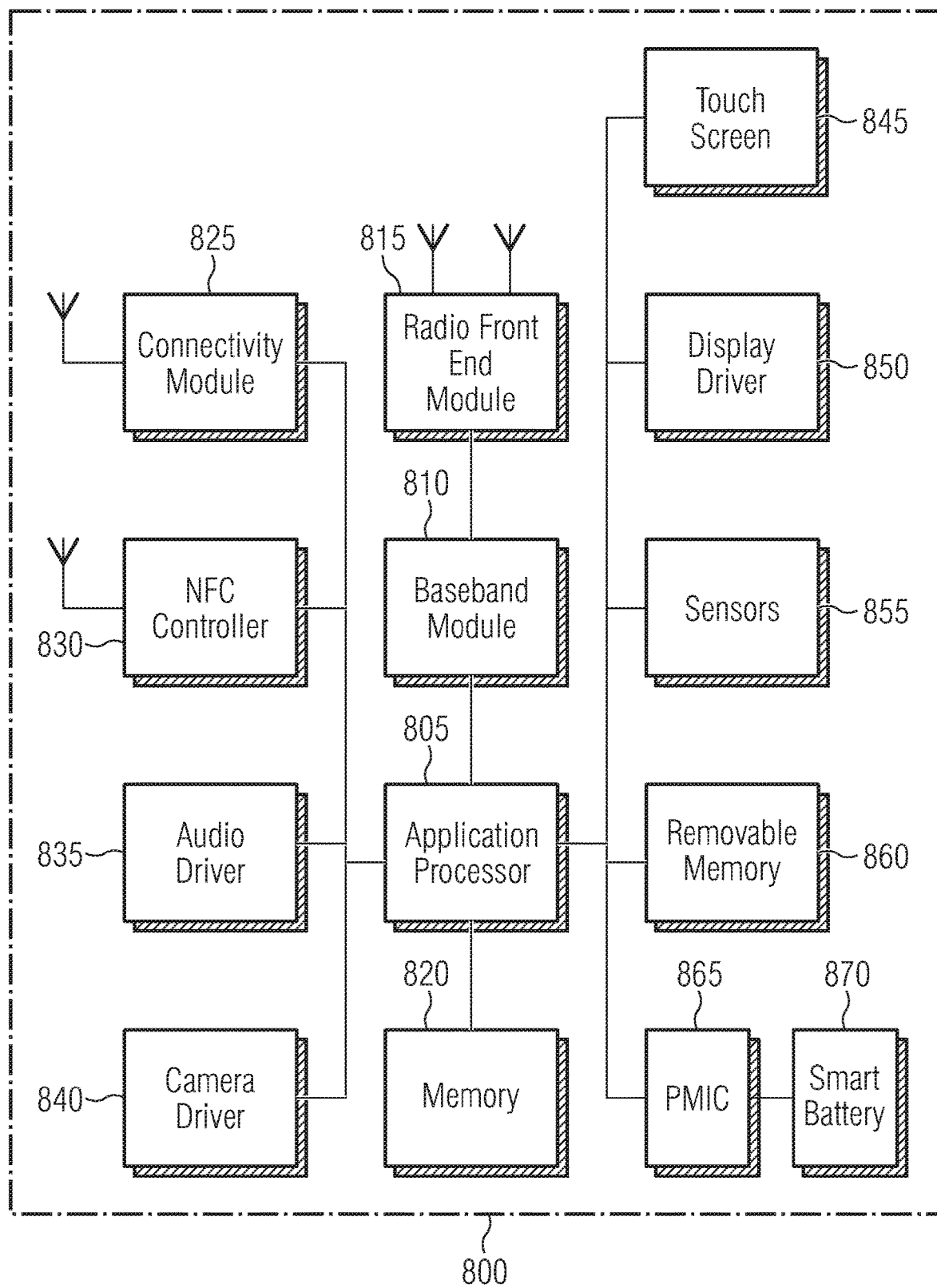
FIG. 8 shows an example of a mobile or user device.

FIG. 8 shows an example of a mobile or user device, which may comprise an example of the bootstrapped switch circuit 10 or an example of the ADC of FIG. 6. FIG. 8 illustrates a user device 800 in accordance with an aspect. The user device 800 may be a mobile device in some aspects and includes an application processor 805, baseband processor 810 (also referred to as a baseband module), radio front end module (RFEM) 815, memory 820, connectivity module 825, near field communication (NFC) controller 830, audio driver 835, camera driver 840, touch screen 845, display driver 850, sensors 855, removable memory 860, power management integrated circuit (PMIC) 865 and smart battery 870.

In some aspects, application processor 805 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (TO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 810 may be implemented, for example, as a solder-down substrate including one or more integrated circuits, a single packaged integrated circuit soldered to a main circuit board, and/or a multi-chip module containing two or more integrated circuits.

Figure 9:
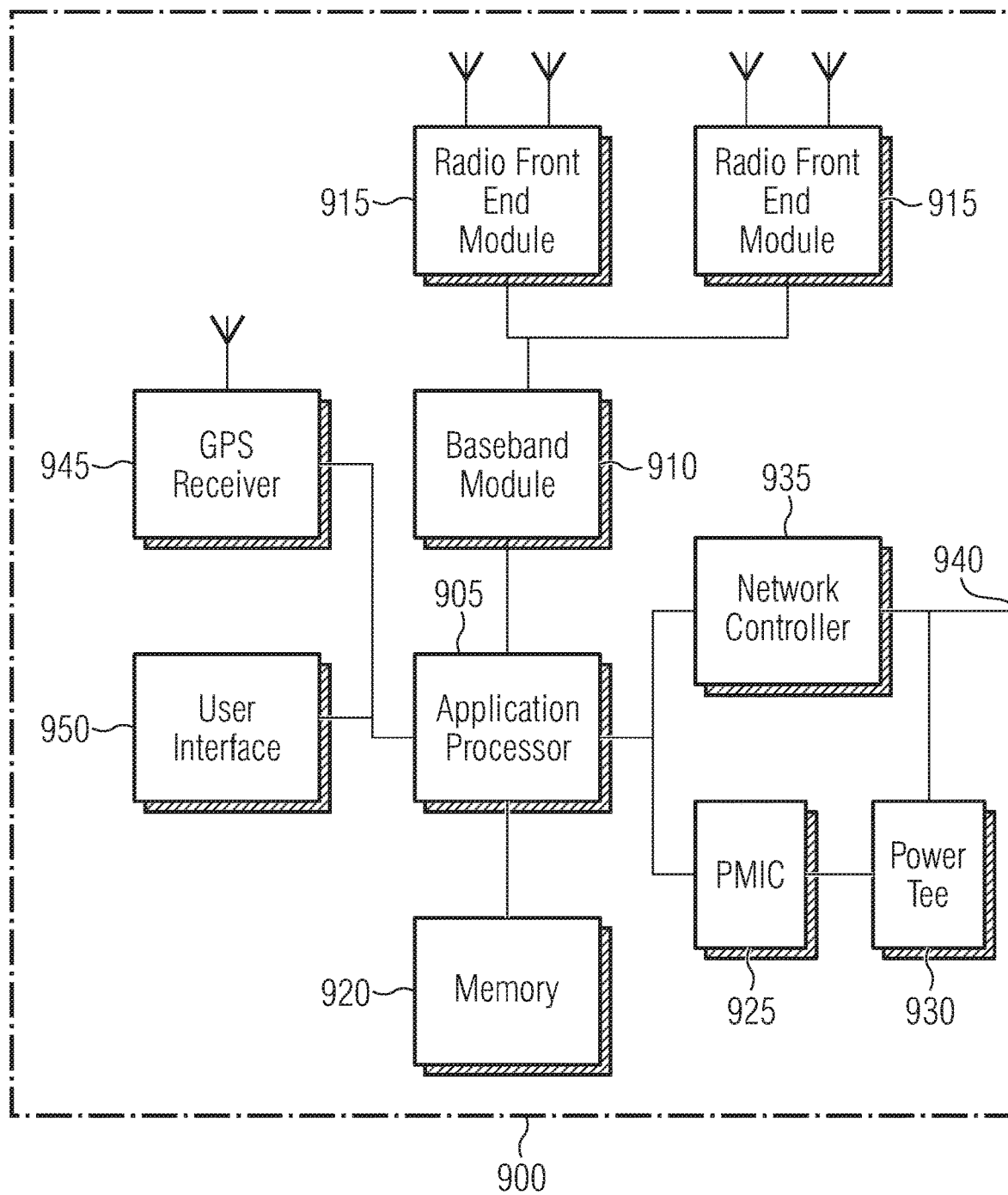
FIG. 9 shows an example of a base station or infrastructure equipment.

FIG. 9 shows an example of a base station or infrastructure equipment, which may comprise an example of the bootstrapped switch circuit 10 or an example of the ADC of FIG. 6. FIG. 9 illustrates a base station or infrastructure equipment radio head 900 in accordance with an aspect. The base station radio head 900 may include one or more of application processor 905, baseband modules 910, one or more radio front end modules 915, memory 920, power management circuitry 925, power tee circuitry 930, network controller 935, network interface connector 940, satellite navigation receiver module 945, and user interface 950.

In some aspects, application processor 905 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose TO, memory card controllers such as SD/MMC or similar, USB interfaces, MIPI interfaces and Joint Test Access Group (JTAG) test access ports.

In some aspects, baseband processor 910 may be implemented, for example, as a solder-down substrate including one or more integrated circuits, a single packaged integrated circuit soldered to a main circuit board or a multi-chip module containing two or more integrated circuits.

In some aspects, memory 920 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 920 may be implemented as one or more of solder down packaged integrated circuits, socketed memory modules and plug-in memory cards.

In some aspects, power management integrated circuitry 925 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 930 may provide for electrical power drawn from a network cable to provide both power supply and data connectivity to the base station radio head 900 using a single cable.

In some aspects, network controller 935 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 945 may include circuitry to receive and decode signals transmitted by one or more navigation satellite constellations such as the global positioning system (GP S), Globalnaya Navigatsionnaya Sputnikovaya Sistema (GLONASS), Galileo and/or BeiDou. The receiver 945 may provide data to application processor 905 which may include one or more of position data or time data. Application processor 905 may use time data to synchronize operations with other radio base stations. In some aspects, user interface 950 may include one or more of physical or virtual buttons, such as a reset button, one or more indicators such as light emitting diodes (LEDs) and a display screen.

Figure 10:
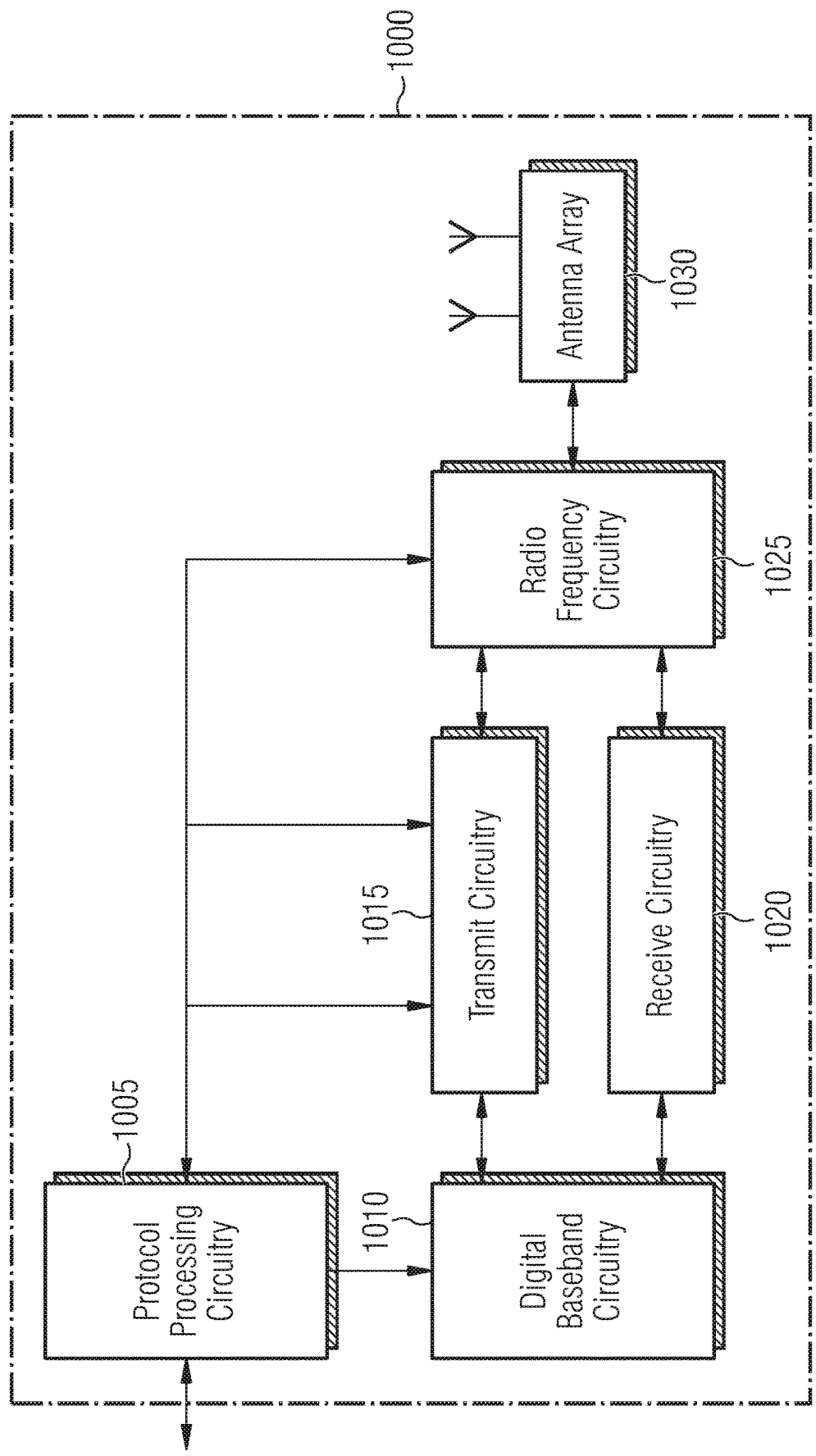
FIG. 10 shows an example of communication circuitry.

FIG. 10 shows an example of communication circuitry, which may comprise an example of the bootstrapped switch circuit 10 or an example of the ADC of FIG. 6. FIG. 10 illustrates an exemplary millimeter wave communication circuitry 1000 according to some aspects. Circuitry 1000 is alternatively grouped according to functions. Components as shown in 1000 are shown here for illustrative purposes and may include other components not shown here in FIG. 10.

Millimeter wave communication circuitry 1000 may include protocol processing circuitry 1005, which may implement one or more of medium access control (MAC), radio link control (RLC), packet data convergence protocol (PDCP), radio resource control (RRC) and nonaccess stratum (NAS) functions. Protocol processing circuitry 1005 may include one or more processing cores (not shown) to execute instructions and one or more memory structures (not shown) to store program and data information.

Millimeter wave communication circuitry 1000 may further include digital baseband circuitry 1010, which may implement physical layer (PHY) functions including one or more of hybrid automatic repeat request (HARM) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 1000 may further include transmit circuitry 1015, receive circuitry 1020 and/or antenna array circuitry 1030.

Millimeter wave communication circuitry 1000 may further include radio frequency (RF) circuitry 1025. In an aspect of the invention, RF circuitry 1025 may include multiple parallel RF chains for one or more of transmit or receive functions, each connected to one or more antennas of the antenna array 1030.

In an aspect of the disclosure, protocol processing circuitry 1005 may include one or more instances of control circuitry (not shown) to provide control functions for one or more of digital baseband circuitry 1010, transmit circuitry 1015, receive circuitry 1020, and/or radio frequency circuitry 1025.

Figure 11:
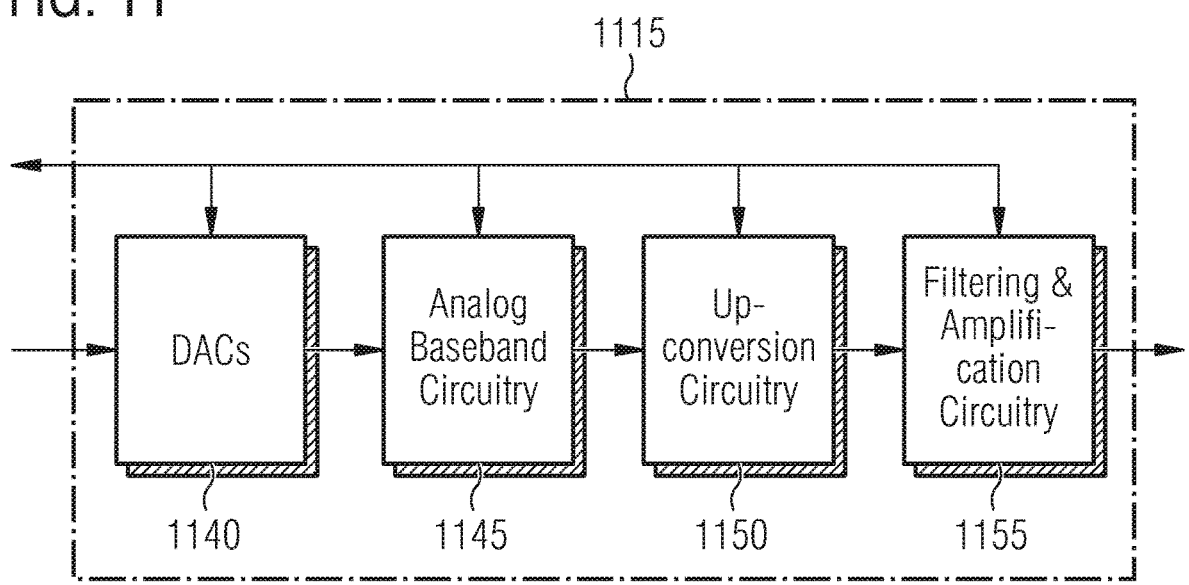
FIG. 11 shows examples for transmit circuitry.
Figure 11:
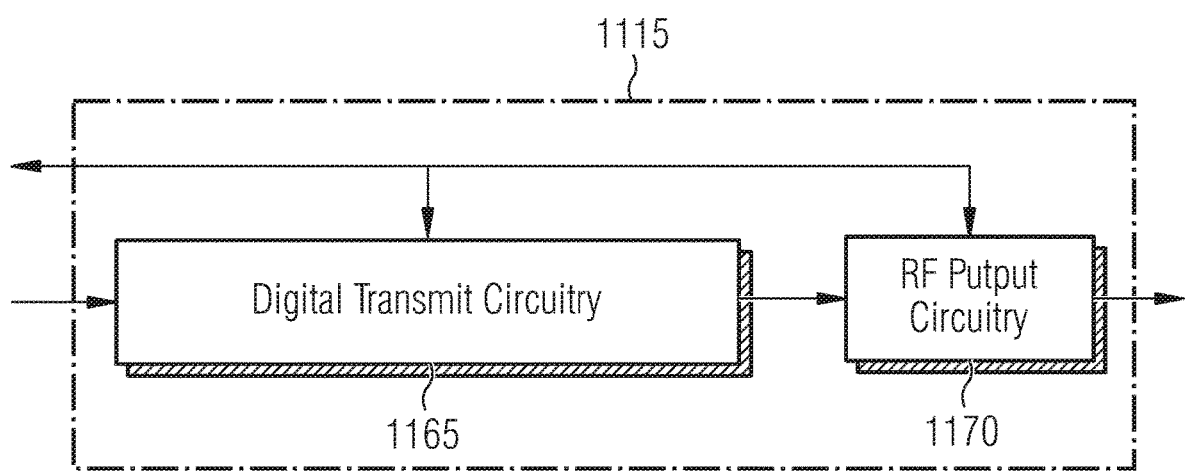

FIG. 11 shows examples for transmit circuitry, which may comprise an example of the bootstrapped switch circuit 10 or an example of the ADC of FIG. 6. FIG. 11 at the top and FIG. 11 at the bottom illustrate examples for transmit circuitry 1115 in FIG. 10 in some aspects.

The exemplary transmit circuitry 1115 of FIG. 11 at the top may include one or more of digital to analog converters (DACs) 1140, analog baseband circuitry 1145, up-conversion circuitry 1150 and filtering and amplification circuitry 1155. In another aspect, FIG. 11 at the bottom illustrates an exemplary transmit circuitry 1115 which includes digital transmit circuitry 1165 and output circuitry 1170.

Figure 12:
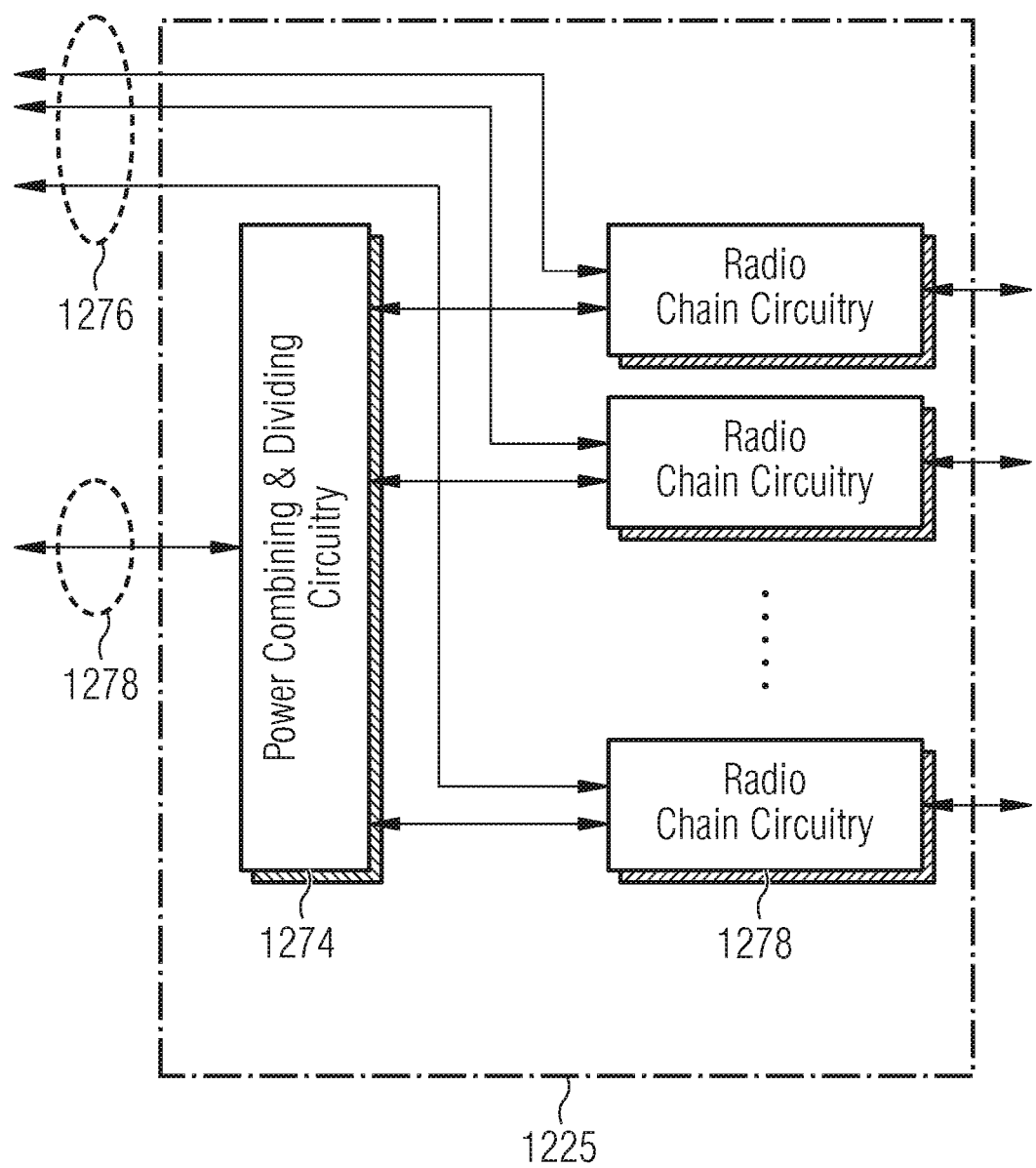
FIG. 12 shows exemplary radio frequency circuitry.

FIG. 12 illustrates an exemplary radio frequency circuitry 1225 in FIG. 10 according to some aspects, which may comprise an example of the bootstrapped switch circuit 10 or an example of the ADC of FIG. 6. Radio frequency circuitry 1225 may include one or more instances of radio chain circuitry 1272, which in some aspects may include one or more filters, power amplifiers, low noise amplifiers, programmable phase shifters and power supplies (not shown).

Radio frequency circuitry 1225 may include power combining and dividing circuitry 1274 in some aspects. In some aspects, power combining and dividing circuitry 1274 may operate bidirectionally, such that the same physical circuitry may be configured to operate as a power divider when the device is transmitting, and as a power combiner when the device is receiving. In some aspects, power combining and dividing circuitry 1274 may one or more include wholly or partially separate circuitries to perform power dividing when the device is transmitting and power combining when the device is receiving. In some aspects, power combining and dividing circuitry 1274 may include passive circuitry comprising one or more two-way power divider/combiners arranged in a tree. In some aspects, power combining and dividing circuitry 1274 may include active circuitry comprising amplifier circuits.

In some aspects, radio frequency circuitry 1225 may connect to transmit circuitry 1015 and receive circuitry 1020 in FIG. 10 via one or more radio chain interfaces 1276 or a combined radio chain interface 1278.

In some aspects, one or more radio chain interfaces 1276 may provide one or more interfaces to one or more receive or transmit signals, each associated with a single antenna structure which may comprise one or more antennas. In some aspects, the combined radio chain interface 1278 may provide a single interface to one or more receive or transmit signals, each associated with a group of antenna structures comprising one or more antennas.

Figure 13:
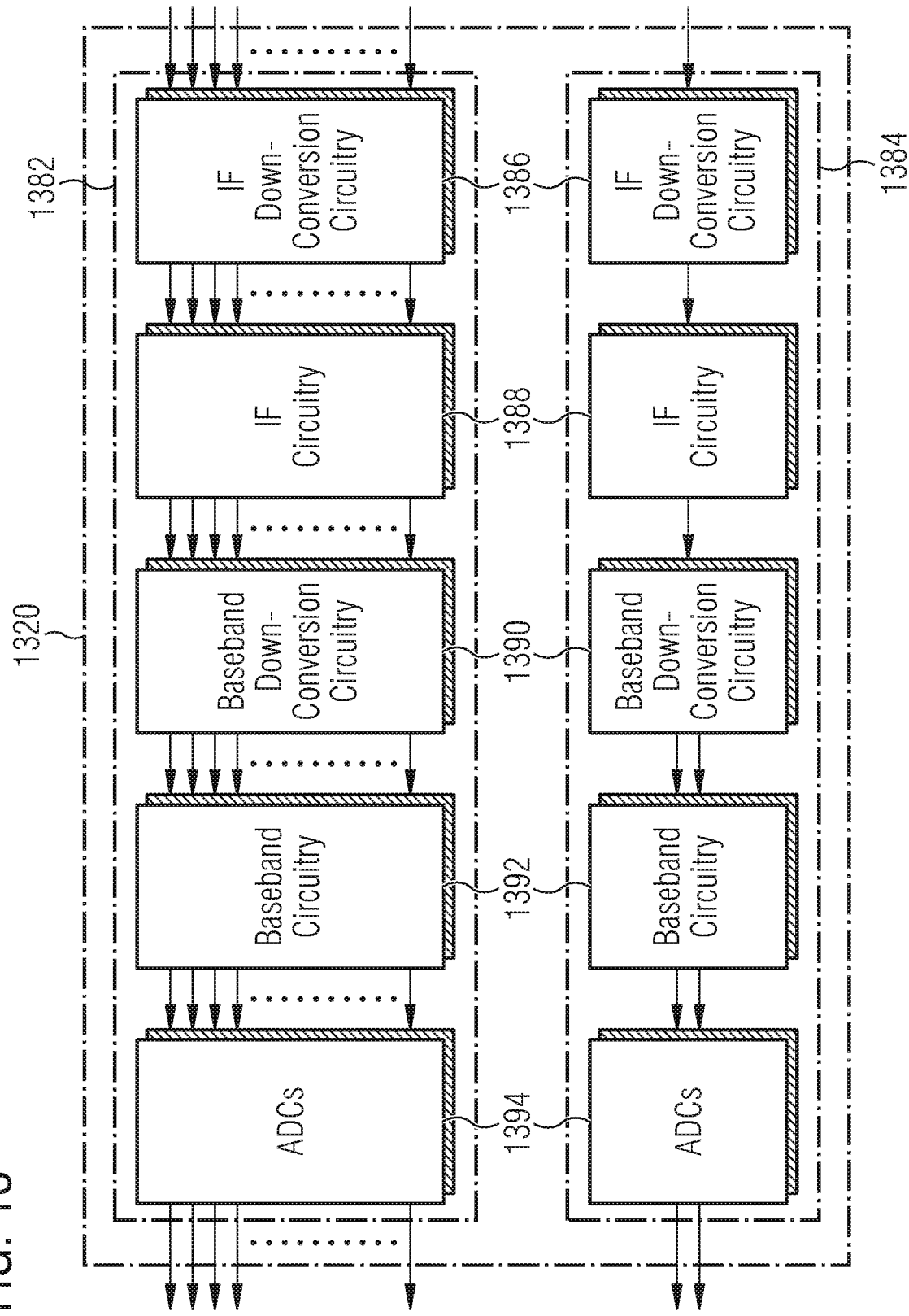
FIG. 13 shows exemplary receive circuitry.

FIG. 13 illustrates exemplary receive circuitry 1020 in FIG. 10 according to some aspects, which may comprise an example of the bootstrapped switch circuit 10 or an example of the ADC of FIG. 6. Receive circuitry 1320 may include one or more of parallel receive circuitry 1382 and/or one or more of combined receive circuitry 1384.

In some aspects, the one or more parallel receive circuitry 1382 and one or more combined receive circuitry 1384 may include one or more Intermediate Frequency (IF) down-conversion circuitry 1386, IF processing circuitry 1388, baseband down-conversion circuitry 1390, baseband processing circuitry 1392 and analog-to-digital converter (ADC) circuitry 1394.

Figure 14:
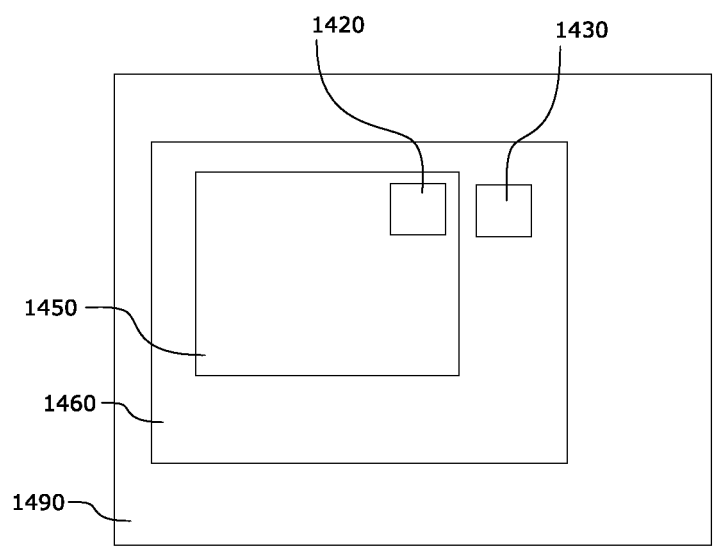
FIG. 14 shows an exemplary schematic of a base station.

FIG. 14 shows a base station 1490 which includes a semiconductor chip 1460. The semiconductor chip 1460 includes an ADC 1450 and a driving circuit 1430. The ADC 1450 includes a track and hold circuit 1420.

The following examples pertain to further embodiments.

Example 1 is a bootstrapped switch circuit, comprising an output for an output signal; a first input; a switching element configured to couple the output with a signal from the first input; a bootstrapper capacitor configured to drive the switching element; and a second input coupled to the bootstrapper capacitor.

Example 2 is the bootstrapped switch circuit of example 1, wherein the first input is configured to receive an analog voltage signal to charge a sampling capacitor coupled to the output of the bootstrapped switch circuit.

Example 3 is the bootstrapped switch circuit of example 1, wherein the switching element is an n-type metal-oxide semiconductor, NMOS, a p-type metal-oxide semiconductor, PMOS, or a pass-gate NMOS with a p-type metal-oxide semiconductor, PMOS, in parallel.

Example 4 is a track-and-hold circuit comprising the bootstrapped switch circuit of example 1.

Example 5 is the track-and-hold circuit of example 4, further comprising a sampling capacitor coupled to the output.

Example 6 is the track-and-hold circuit of example 4, further comprising a driving circuit configured to provide two coupled driving signals for the first and second inputs of the bootstrapped switch circuit.

Example 7 is the track-and-hold circuit of example 6, wherein the driving circuit is further configured to provide the two coupled driving signals as in-phase signals with a phase mismatch of less than 10% of a sampling clock period and wherein the driving circuit is further configured to provide the two coupled driving signals with amplitudes differing by less than 25%.

Example 8 is the track-and-hold circuit of example 6, wherein the driving circuit is further configured to provide the two coupled driving signals as voltage signals.

Example 9 is the track-and-hold circuit of example 6, wherein the driving circuit is further configured to provide the two coupled driving signals as a closed loop driving signal and an open loop driving signal.

Example 10 is the track-and-hold circuit of example 6, wherein the driving circuit comprises an operational amplifier circuit, which is configured to provide the two coupled driving signals as voltage signals.

Example 11 is the track-and-hold circuit of example 5, further comprising an operational amplifier with at least a closed loop output coupled to the first input of the bootstrapped switch circuit and an open loop output coupled to the second input of the bootstrapped switch circuit.

Example 12 is the track-and-hold circuit of example 11, wherein the open loop output comprises an open-loop voltage-follower in tracking with the closed loop output and driven by a current-mode operational transconductance amplifier.

Example 13 is the track-and-hold circuit of example 12, wherein the open-loop voltage-follower is a class AB output of the operational amplifier.

Example 14 is an analog-to-digital converter comprising one or more track-and-hold circuits of example 5.

Example 15 is the analog-to-digital converter of example 14, comprising a plurality of track-and-hold circuits and being configured to operate in a time-interleaved manner.

Example 16 is a semiconductor chip with the analog-to-digital converter of example 14.

Example 17 is the semiconductor chip of example 16, further comprising a driving circuit configured to provide two coupled driving signals for driving the one or more track-and-hold circuits.

Example 18 is a base station for a mobile communication system with the analog-to-digital converter of example 14.

Example 19 is the base station of example 18, further comprising a driving circuit configured to provide two coupled driving signals for driving the one or more track-and-hold circuits.

Example 20 is a mobile device for a mobile communication system with the analog-to-digital converter of example 14.

Example 21 is the mobile device of example 20, further comprising a driving circuit configured to provide two coupled driving signals for driving the one or more track-and-hold circuits.

Example 22 is a method for operating a track-and-hold circuit, the method comprising generating a first driving signal using a closed-loop output of an operational amplifier circuit based on an input signal; generating a second driving signal using an open-loop output of the operational amplifier circuit based on the input signal; using the first input signal to charge a sampling capacitor via a switching element; and using the second driving signal to drive the switching element via a bootstrapper capacitor.

Example 23 is the method of example 22, further comprising operating a plurality of track-and-hold circuits in a time interleaved manner.

Example 24 is an apparatus for operating a track-and-hold circuit, the apparatus comprising means for generating a first driving signal using a closed-loop output of an operational amplifier circuit based on an input signal; means for generating a second driving signal using an open-loop output of the operational amplifier circuit based on the input signal; means for using the first input signal to charge a sampling capacitor via a switching element; and means for using the second driving signal to drive the switching element via a bootstrapper capacitor.

Example 25 is the method of example 24, further comprising means for operating a plurality of track-and-hold circuits in a time interleaved manner.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

The invention claimed is:

1. A track-and-hold circuit, comprising:
   a bootstrapped switch circuit, comprising:
      an output for an output signal,
      a first input,
      a switching element configured to couple the output with a signal from the first input,
      a bootstrapper configured to drive the switching element, wherein the bootstrapper includes a bootstrapper capacitor, and
      a second input coupled to the bootstrapper; and
   a driving circuit configured to provide two coupled driving signals for the first and second inputs of the bootstrapped switch circuit,
   wherein the driving circuit is further configured to provide the two coupled driving signals as a closed loop driving signal and an open loop driving signal.

2. The track-and-hold circuit of claim 1, wherein the driving circuit is further configured to provide the two coupled driving signals as voltage signals.

3. The track-and-hold circuit of claim 1, wherein the driving circuit is further configured to provide the two coupled driving signals as in-phase signals with a phase mismatch of less than 10% of a sampling clock period and wherein the driving circuit is further configured to provide the two coupled driving signals with amplitudes differing by less than 25%.

4. The track-and-hold circuit of claim 1, wherein the driving circuit comprises an operational amplifier circuit, which is configured to provide the two coupled driving signals as voltage signals.

5. A track-and-hold circuit, comprising:
   a bootstrapped switch circuit, comprising:
      an output for an output signal,
      a first input,
      a switching element configured to couple the output with a signal from the first input,
      a bootstrapper configured to drive the switching element, wherein the bootstrapper includes a bootstrapper capacitor, and
      a second input coupled to the bootstrapper;
   a sampling capacitor coupled to the output; and
   an operational amplifier with at least a closed loop output coupled to the first input of the bootstrapped switch circuit and an open loop output coupled to the second input of the bootstrapped switch circuit.

6. The track-and-hold circuit of claim 5, wherein the open loop output comprises an open-loop voltage-follower in tracking with the closed loop output and driven by a current-mode operational transconductance amplifier.

7. The track-and-hold circuit of claim 6, wherein the open-loop voltage-follower is a class AB output of the operational amplifier.

8. An analog-to-digital converter comprising one or more track-and-hold circuits of claim 5.

9. The analog-to-digital converter of claim 8, comprising a plurality of track-and-hold circuits and being configured to operate in a time-interleaved manner.

10. A semiconductor chip with the analog-to-digital converter of claim 8.

11. The semiconductor chip of claim 10, further comprising a driving circuit configured to provide two coupled driving signals for driving the one or more track-and-hold circuits.

12. A base station for a mobile communication system with the analog-to-digital converter of claim 8.

13. The base station of claim 12, further comprising a driving circuit configured to provide two coupled driving signals for driving the one or more track-and-hold circuits.

14. A mobile device for a mobile communication system with the analog-to-digital converter of claim 8.

15. The mobile device of claim 14, further comprising a driving circuit configured to provide two coupled driving signals for driving the one or more track-and-hold circuits.

16. A method for operating a track-and-hold circuit, the method comprising:
   generating a first driving signal using a closed-loop output of an operational amplifier circuit based on an input signal;
   generating a second driving signal using an open-loop output of the operational amplifier circuit based on the input signal;
   using the first driving signal to charge a sampling capacitor via a switching element; and
   using the second driving signal to drive the switching element via a bootstrapper including a bootstrapper capacitor.

17. The method of claim 16, further comprising operating a plurality of track-and-hold circuits in a time interleaved manner.

18. A track-and-hold circuit, comprising:
   a switching element;
   a sampling capacitor;
   a bootstrapper including a bootstrapper capacitor; and
   an operational amplifier having a closed-loop output and an open-loop output,
   wherein the operational amplifier is configured to generate, based on an input signal, a first driving signal at the closed loop output and a second driving signal at an open-loop output;
   wherein the switching element is configured to be driven by the second driving signal via the bootstrapper capacitor, and wherein the sampling capacitor is configured to be charged by the first driving signal via the switching element.

19. The track-and-hold circuit of claim 18, wherein the switching element is an n-type metal-oxide semiconductor, NMOS, a p-type metal-oxide semiconductor, PMOS, or a pass-gate NMOS with a p-type metal-oxide semiconductor, PMOS, in parallel.

20. The track-and-hold circuit of claim 18, wherein the operational amplifier circuit is configured to provide the first and second driving signals as voltage signals.

21. An analog-to-digital converter comprising one or more track-and-hold circuits of claim 18.

22. A base station for a mobile communication system comprising the analog-to-digital converter of claim 21.

* * * * *